United States Patent [19]

Hidaka

[11] Patent Number: 5,031,140

[45] Date of Patent: Jul. 9, 1991

[54] BLOCH-LINE MEMORY DEVICE FOR STABLY READING INFORMATION

[75] Inventor: Yasuharu Hidaka, Tokyo, Japan

[73] Assignee: NEC Corporation, Japan

[21] Appl. No.: 470,124

[22] Filed: Jan. 25, 1990

[30] Foreign Application Priority Data

Jan. 26, 1989 [JP] Japan .................................. 1-19048

[51] Int. Cl.$^5$ ............................................. G11C 11/14
[52] U.S. Cl. .......................................... 365/29; 365/87
[58] Field of Search ................................. 365/29, 87

[56] References Cited

U.S. PATENT DOCUMENTS 4,845,671 7/1989 Maruyama et al. .................... 365/87

Primary Examiner—Joseph A. Popek

Attorney, Agent, or Firm—Leydig, Voit & Mayer

[57] ABSTRACT

A Bloch-line memory device comprises a magnetic medium including a read-out area and a potential barrier portion. The read-out area is on the principal surface of the magnetic medium and the potential barrier portion is located between the read-out area an a predetermined end portion of one or more domains. A pulsed magnetic field is strenghtened during a predetermined time interval to expand the magnetic domain towards the read-out area. When a magnetic domain with a single Block line at its end portion is expanded into the read-out area, the magnetic domain is chopped to produce a magnetic bubble. The magnetic bubble is detected by a detecting circuit and an output signal representative of an information signal is generated.

4 Claims, 5 Drawing Sheets

BLOCH-LINE MEMORY DEVICE FOR STABLY READING INFORMATION

BACKGROUND OF THE INVENTION

This invention relates to a Bloch-line memory device for memorizing information as a pair of vertical Bloch lines in a domain wall which surrounds a magnetic domain formed in a magnetic medium.

A Bloch-line memory device of the type described comprises a magnetic medium having a principal surface and an easy axis of magnetization orthogonal to the principal surface. The magnetic medium comprises at least one magnetic domain having a stripe shape and surrounded by a domain wall which is orthogonal to the principal surface and parallel to the easy axis. The magnetic domain has a pair of opposite end portions and an intermediate portion between the end portions.

When the Bloch-line memory device is supplied with an information signal by a magnetic field generated parallel to the easy axis, the domain wall memorizes the information signal as a pair of Bloch lines at one of the end portions. The Bloch line pair is propagated along the domain wall. On producing an output signal representative of the information signal, a magnetic bubble is generated in accordance with existence or non-existence of the pair of Bloch lines at a predetermined one of the end portions that may or may not be identical with the first-mentioned one of the end portions.

A conventional Bloch-line memory device is disclosed in Japanese Unexamined Patent Publication No. 144,487/1988 (Kokai Syō 63-144487) filed by the present assignee. In the conventional Bloch-line memory device, the magnetic medium comprises a read-out portion which is formed on the principal surface. The magnetic domain is partially expanded to the read-out portion along the principal surface parallel to the intermediate portion. The magnetic domain is chopped at the read-out portion in accordance with the number of Bloch lines in the predetermined end portion to generate a magnetic bubble. More specifically, the magnetic domain is chopped at the read-out portion to generate the magnetic bubble when the pair of Bloch lines exist in the predetermined end portion.

It is difficult with the conventional Bloch-line memory device to stably generate the magnetic bubble because the magnetic domain is expanded to the read-out portion and is chopped independent of the number of vertical Bloch lines existing at one of the end portions.

SUMMARY OF THE INVENTION

It is therefore an object of the present invention to provide a Bloch line memory device which is capable of stably generating a magnetic bubble, depending on the number of vertical Bloch lines at one of the end portions.

It is another object of this invention to provide a Bloch line memory device of the type described, which is simple in structure.

Other objects of this invention will become clear as the description proceeds.

According to the invention, a Bloch-line memory device comprises a magnetic medium having a principal surface and an easy axis of magnetization orthogonal to the principal surface. The magnetic medium includes at least one magnetic domain surrounded by a domain wall which is orthogonal to the principal surface and has a pair of opposite end portions. The domain wall can include a single Bloch line and can optionally include a pair of Bloch lines representing an information signal. The magnetic medium further includes a read-out area and a potential barrier portion. The read-out area is located on the principal surface and has a read-out area potential. The potential barrier portion is located between the read-out area and a predetermined end portion, is orthogonal to the axis, and has a barrier portion potential which is higher than the read-out area potential. The Bloch-line memory device also comprises a generator for generating a pulsed magnetic field parallel to the axis to expand one of the end portions of the magnetic domain parallel to the principal surface; a mechanism for strengthening the pulsed magnetic field during a predetermined interval to expand the magnetic domain towards the read-out area; a mechanism for producing a magnetic bubble from the magnetic domain having the single Bloch line at the predetermined end portion when the magnetic domain is expanded into the read-out area; and a detector for detecting the magnetic bubble and producing an output signal.

DESCRIPTION OF THE PREFERRED EMBODIMENT

Figure 1:
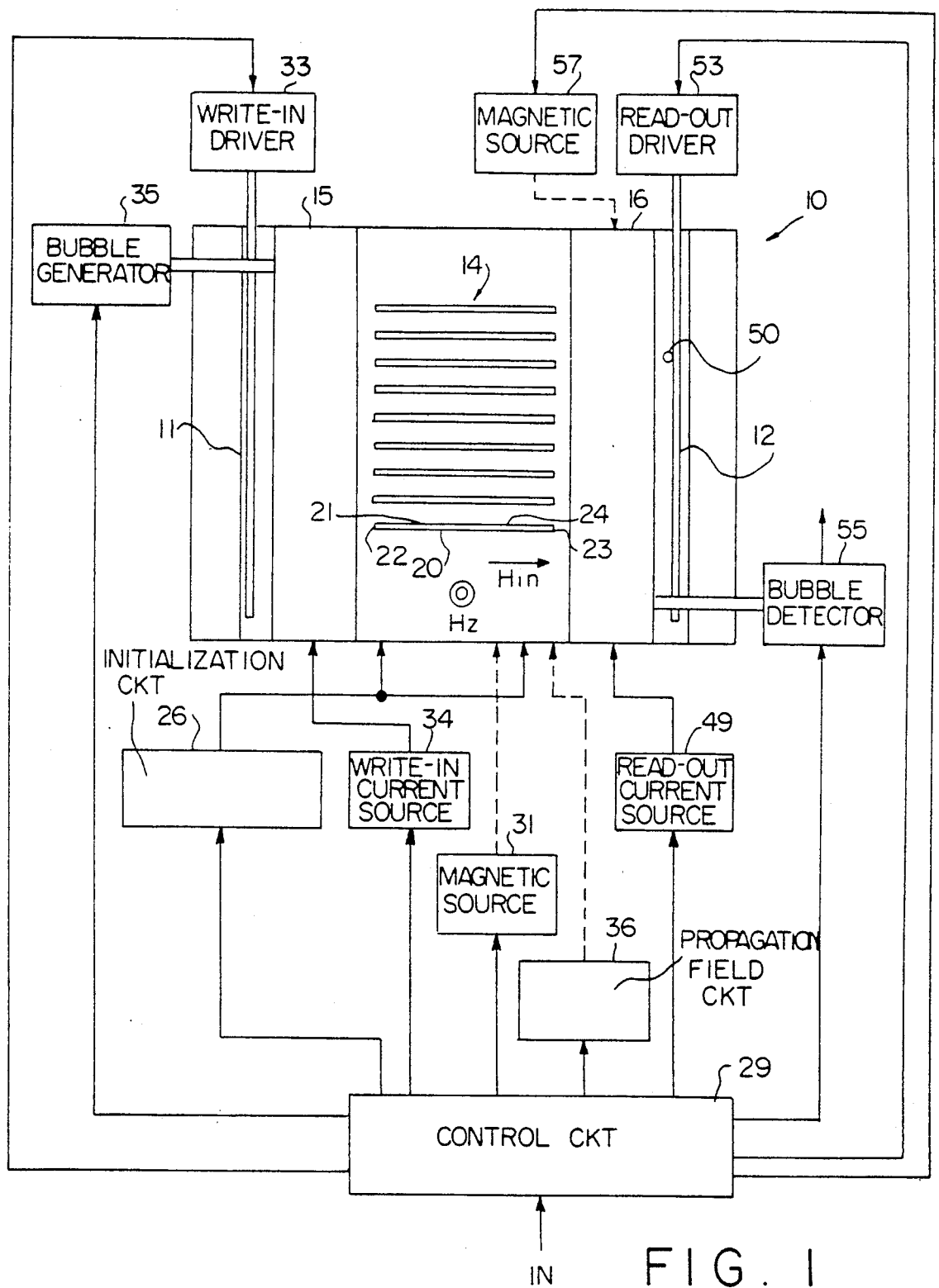
FIG. 1 is a block diagram of a Bloch-line memory device according to an embodiment of the present invention.

Referring to FIG. 1, a Bloch-line memory device according to a preferred embodiment of the present invention comprises a magnetic medium 10, such as a garnet layer, having a principal surface on the plane of FIG. 1 and an easy axis of magnetization orthogonal to the principal surface. On the magnetic medium 10, the Bloch-line memory device comprises first and second strip lines 11 and 12 at first and second predetermined positions, respectively, and a memory section 14 between the first and the second predetermined positions.

A write-in section 15 is laid along the first strip line 11 with a first spacing left from the first strip line 11. A read-out section 16 is laid along the second strip line 12 with a second spacing left from the second strip line 12.

On forming a plurality of stripe magnetic domains 20 in the memory section 14, an orthogonal magnetic field Hz is preliminarily applied to the magnetic medium 10 parallel to the easy axis of magnetization and a first in-plane magnetic field Hin is applied to the magnetic medium 10 longitudinally of the magnetic domain 20 as known in the art. An initialization circuit 26 is controlled by a control circuit 29 to supply an initialization current to the memory section 14 to thereby form the stripe magnetic domains 20.

Each magnetic domain 20 is surrounded by a domain wall 21 which is orthogonal to the principal surface of the magnetic medium 10 and parallel to the easy axis of magnetization. Each magnetic domain 20 has first and second end portions 22 and 23 which are located leftwardly and rightwardly of the magnetic domain 20 in the figure, respectively. The magnetic domain 20 has an intermediate portion 24 between the first end portion and second end portions 22 and 23. Each of the magnetic domains 20 is for memorizing an information signal as a pair of Bloch lines which are parallel to the easy axis of magnetization.

Writing operation proceeds as follows on generating the Bloch lines of a pair. The control circuit 29 is supplied with the information signal as indicated by a short line IN. A pulsed bias magnetic field is applied antiparallel to or reversedly parallel to the orthogonal magnetic field Hz by a first magnetic source 31 controlled by the control circuit 29. Immediately subsequently, the first strip line 11 is driven by a write-in driver 33 controlled by the control circuit 29. In this case, a magnetic bubble travels along the first strip line 11 towards the bottom of FIG. 1. The magnetic bubble is generated by a bubble generator 35 controlled by the control circuit 29. Furthermore, the write-in section 15 is substantially simultaneously supplied with a write-in current from a write-in current source 34 controlled by the control circuit 29. In the meantime, the initialization circuit 26 is put out of operation with the stripe magnetic domains 20 kept remaining.

The read-out section 16 will presently be described more in detail. The Bloch line pair will shortly be illustrated.

In the manner described in U.S. Pat. No. 4,926,377 filed Aug. 11, 1989 by Yasuharu Hidaka, the instant applicant, based on Japanese Patent Application No. 201,614 of 1988, the pulsed magnetic field causes each of magnetic domains 20 to expand parallel to the principal surface to an expanded domain which reaches the write-in section 15 and will later be illustrated. The Bloch line pair is transferred from the first end portion 22 to the second end portion 23 in the manner known in the art by a propagation field circuit 36 which is controlled by the control circuit 29.

Referring to FIG. 1 and additionally to FIG. 2(a), the read-out section 16 of a conventional Bloch-line memory device will be described. A single magnetic domain is illustrated as one of the magnetic domains 20. In the single magnetic domain 20, the first end portion 22 is not illustrated. When the bias magnetic field Hz is directed frontwards of FIG. 2(a), magnetization is directed within the magnetic domain 20 backwards of the figure, as shown by an encircled crisscross 37.

It is assumed that a single Bloch line 38 is previously located in the second end portion 23 independently of the Bloch line pair. The single Bloch line 38 is parallel to the easy axis of magnetization. In FIG. 2(a), the single Bloch line 38 is depicted as if it were parallel to the principal surface. This is merely for convenience of illustration.

Figure 2A:
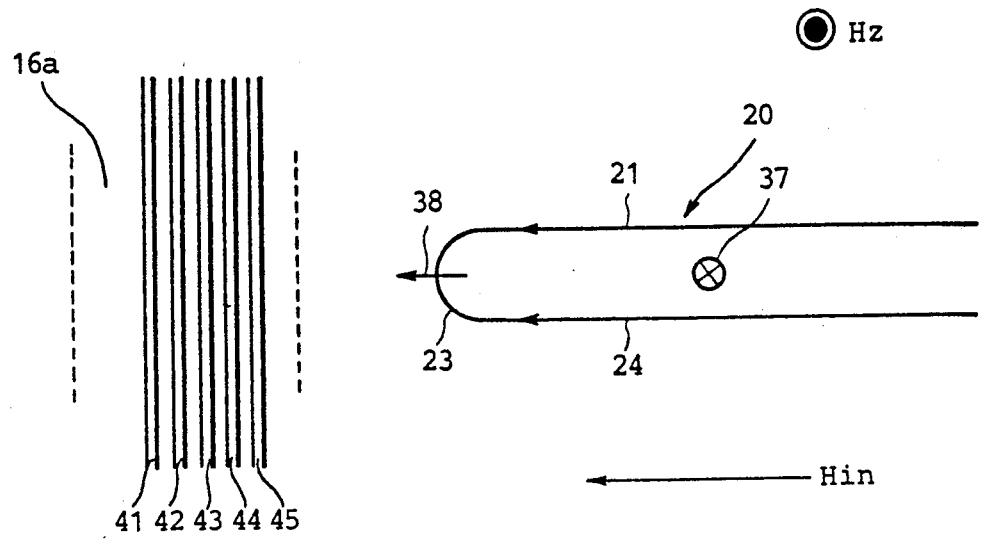
FIGS. 2(a) through 2(d) are top views of a read-out section used in a conventional Bloch-line memory device.
Figure 2B:
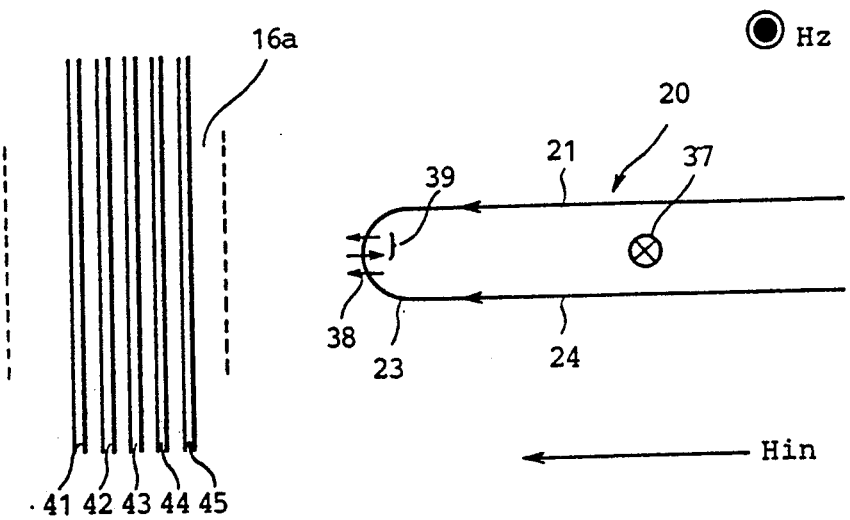

Turning to FIG. 2(b), a pair of Bloch lines 39 and the single Bloch line 38 are located in the second end portion 23 after the information signal is memorized in the magnetic domain 20. The Bloch line pair 39 is depicted like the single Bloch line 38.

Turning back to FIG. 2(a), the read-out section 16 comprises a read-out area 16a extending on the principal surface orthogonal to the easy axis. First through fifth conductors 41 to 45 are formed on the read-out area 16a with a predetermined space interval. The first through the fifth conductors 41 to 45 extend along the read-out area 16a parallel to the second strip line 12 depicted in FIG. 1. The first through the fifth conductors 41 to 45 are connected to a read-out current source 49 (FIG. 1).

Referring to FIG. 1 and FIGS. 2(a) and (b) and presently to FIG. 2(c), description will be made as regards read-out operation of a conventional Bloch-line memory device in order to facilitate an understanding of the present invention. The first magnetic source 31 is controlled by the control circuit 29 to supply the pulsed bias magnetic field to the principal surface antiparallel to the orthogonal magnetic field Hz. As a result, the magnetic domain 20 is expanded parallel to the principal surface to the read-out area 16a as known in the art into an expanded magnetic domain 20' having an expanded second end portion 23' in the manner depicted in FIG. 2(c).

The read-out current source 49 is controlled by the control circuit 29 to supply electric currents to the first, the third, the fifth conductors 41, 43, and 45. As a result, a second in-plane magnetic field Hip is applied antiparallel to the first in-plane magnetic field Hin on the read-out area 16a. In case where the single Bloch line 38 and the Bloch line pair 39 exist at the second end portion 23 as shown in FIG. 2(b), one of the Bloch line pair 39 is held at the second end portion 23' in the manner known in the art. The single Bloch line 38 and the other of the Bloch line pair 39 are moved to the intermediate end portion 24 as known in the art.

About 2 microseconds later, the read-out current source 49 is controlled by the control circuit 29 to supply electric currents additionally to the second and the fourth conductors 42 and 44 towards the top of FIG. 2(c). The expanded magnetic domain 20' is chopped at the expanded second end portion 23' to produce a magnetic bubble 50 (FIG. 1) as known in the art. The magnetic bubble 50 is transferred towards the bottom of FIG. 1 along the second strip line 12 by a read-out driver 53 under control of the control circuit 29. The magnetic bubble 50 is detected by a bubble detector 55 under control of the control circuit 29 to produce an output signal representative of the information signal.

In case where the single Bloch line 38 alone exists at the second end portion 23 as shown in FIG. 2(a) without the Bloch line pair 39, the single Bloch line 38 is moved to the intermediate end portion 24. Magnetization is put into unichiral at the expanded second end portion 23'. Namely, the magnetization becomes antiparallel at opposing magnetic wall portions of the intermediate portion 24. In this case, the expanded magnetic domain 20' can not be chopped because the single Bloch line 38 is not held at the expanded second portion 23'. As a result, no magnetic bubble is produced.

Figure 2C:
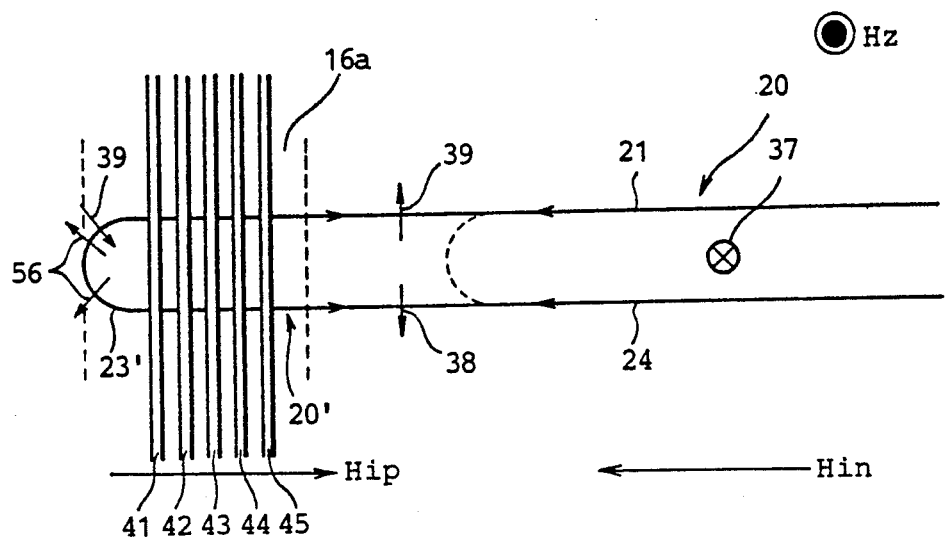

When the single magnetic domain 20 is expanded, an undesired Bloch line pair 56 may be generated in the manner depicted in FIG. 2(c). The undesired Bloch line pair 56 is transferred to the expanded second end portion 23' by the second in-plane magnetic field Hip when the single Bloch line 38 and the Bloch line pair 39 are already generated in the single magnetic domain 20. In this case, one of the Bloch lines of the pair 39 and the undesired Bloch line pair 56 are held at the expanded second end portion 23'. The expanded magnetic domain 20' is chopped at the expanded second end portion 23' to produce the magnetic bubble 50 because at least one Bloch line is held at the expanded second end portion 23'.

Figure 2D:
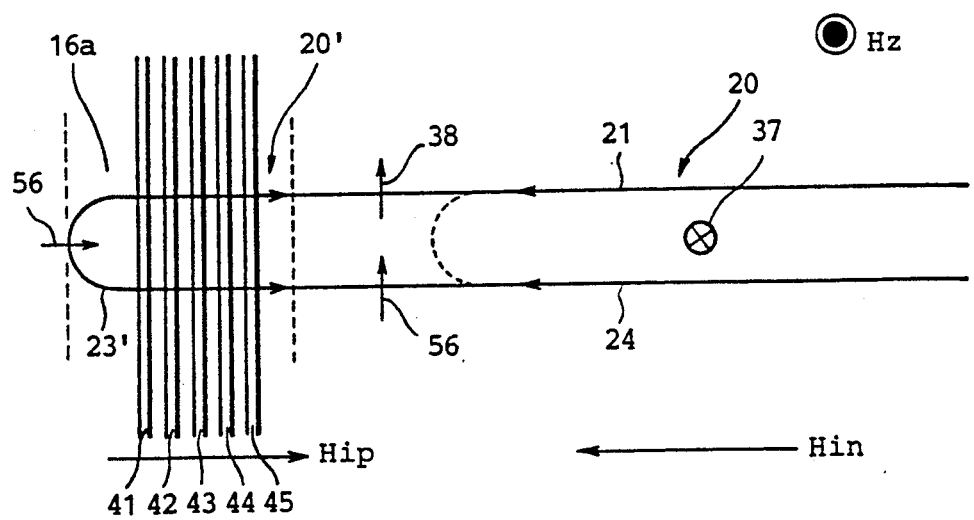

Referring to FIG. 2(d), one of the undesired Bloch line pair 56 is held at the expanded second end portion 23' and the other of the undesired Bloch line pair 56 is transferred to the intermediate portion 24 when the single Bloch line 38 is already generated in the single magnetic domain 20 without the Bloch line pair 39. The expanded magnetic domain 20' is chopped at the expanded second end portion 23' because one of the undesired Bloch line pair 56 is held at the expanded second end portion 23'. As a result, read-out operation becomes faulty.

Referring again to FIG. 1, the Bloch-line memory device comprises a second magnetic source 57 controlled by the control circuit 29. The read-out section 16, the control circuit 29, the first magnetic source 31, and the read-out current source 49 are operable in a manner different from that of the conventional Bloch-line memory device in the manner described in the following.

Figure 3A:
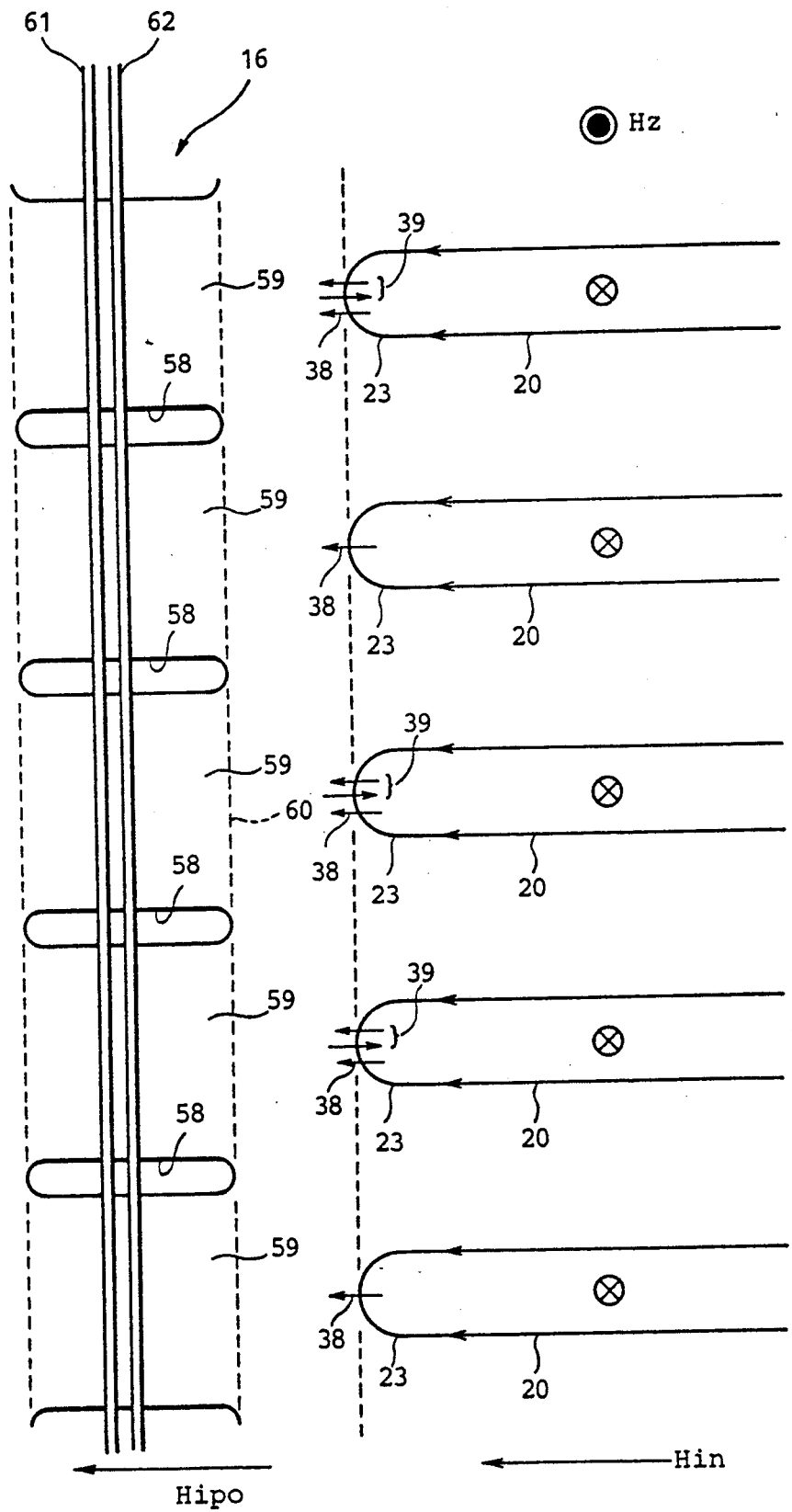
FIGS. 3(a) and 3(b) are top views of a read-out section used in the Bloch-line memory device illustrated in FIG. 1.

Referring to FIG. 3(a), the read-out section 16 is illustrated between a pair of dashed lines representative of boundaries thereof together with an adjacent portion of the memory section 14 illustrated in FIG. 1. It will be understood from the figure that some of the magnetic domains 20 are used as mere domains in which no Bloch line pair is memorized at the second end portion 23. Others of the magnetic domains 20 are used as memory domains in which the Bloch line pair 39 is memorized at the second end portion 23. More particularly, the single Bloch line 38 alone is held in each of the mere domains at the second end portion 23. The single Bloch line 38 and the Bloch line pair 39 are held in each of the memory domains at the second end portion 23.

In the read-out section 16, grooves 58 are formed parallel to the magnetic domains 20 between extensions of the magnetic domains 20, extending between the dashed lines. Each groove 58 is about 2 microns deep and is formed, for example, by a known etching process.

In the read-out section 16, gate portions 59 are left between adjacent pairs of the grooves 58 collectively as a read-out area which corresponds to the read-out area 16a described in conjunction with FIG. 2(a). It has been found that the gate portions 59 have a read-out area potential in common and that a potential barrier portion 60 is formed along one of the boundaries of the read-out section 16 to have a barrier portion potential which is higher than the read-out area potential. The gate portions 59 are used as the read-out area 16a in the manner which will later become clear.

The read-out section 16 comprises first and second gate conductors 61 and 62 on the gate portions 59 and over the grooves 58 parallel to the boundaries thereof. The first and the second gate conductors 61 and 62 are connected to the read-out current source 49 depicted in FIG. 1.

Referring to FIGS. 1 and FIG. 3(a), description will be made as regards read-out operation of the Bloch-line memory device. In FIGS. 1 and FIG. 3(a), use is not made of the second in-plane magnetic field Hip. The read-out current source 49 is used as will later be described. Instead, the second magnetic source 57 is controlled by the control circuit 29 to supply a third in-plane magnetic field Hipo to the principal surface parallel to the first in-plane magnetic field Hin. The third in-plane magnetic field Hipo holds the single Bloch line 38 at the second end portion 23 of the mere domains and the single Bloch line 38 and the Bloch line pair 39 at the second end portion 23 of the memory domains. During a predetermined time interval which is for example, 1 microsecond and is shorter than that described in conjunction with FIG. 2(c), the first magnetic source 31 is controlled by the control circuit 29 to supply the principal surface antiparallel to the orthogonal magnetic field Hz with a strong pulsed bias magnetic field which is stronger than the pulsed bias magnetic field described in connection with FIG. 2(c). For example, an average strength of the strong pulsed bias magnetic field is 1.1 through 1.5 times that of the pulsed bias magnetic field described in connection with FIG. 1 alone. The strong pulsed bias magnetic field expands the mere and the memory magnetic domains at first and second expanding speeds in the manner which will presently be described.

It has been found by the present applicant in connection with the first and the second expanding speeds that an expanding speed is different in general depending on the number of the Bloch line or lines at the end portion of the magnetic domain 20. More specifically, the expanding speed is inversely proportional to the number of Bloch lines at the end portion of the magnetic domain 20 and linearly proportional to a damping constant $\alpha$ of the magnetic medium 10. When there is no Bloch line at the end portion of one of the magnetic domains 20, the expanding speed is inversely proportional to the damping constant as regards the magnetic domain 20 in question.

The first expanding speed is equal to at least about ten times the second expanding speed. As for the garnet, the damping constant is about 0.11. In this event, the first expanding speed is equal to about one hundred times the second expanding speed.

Figure 3B:
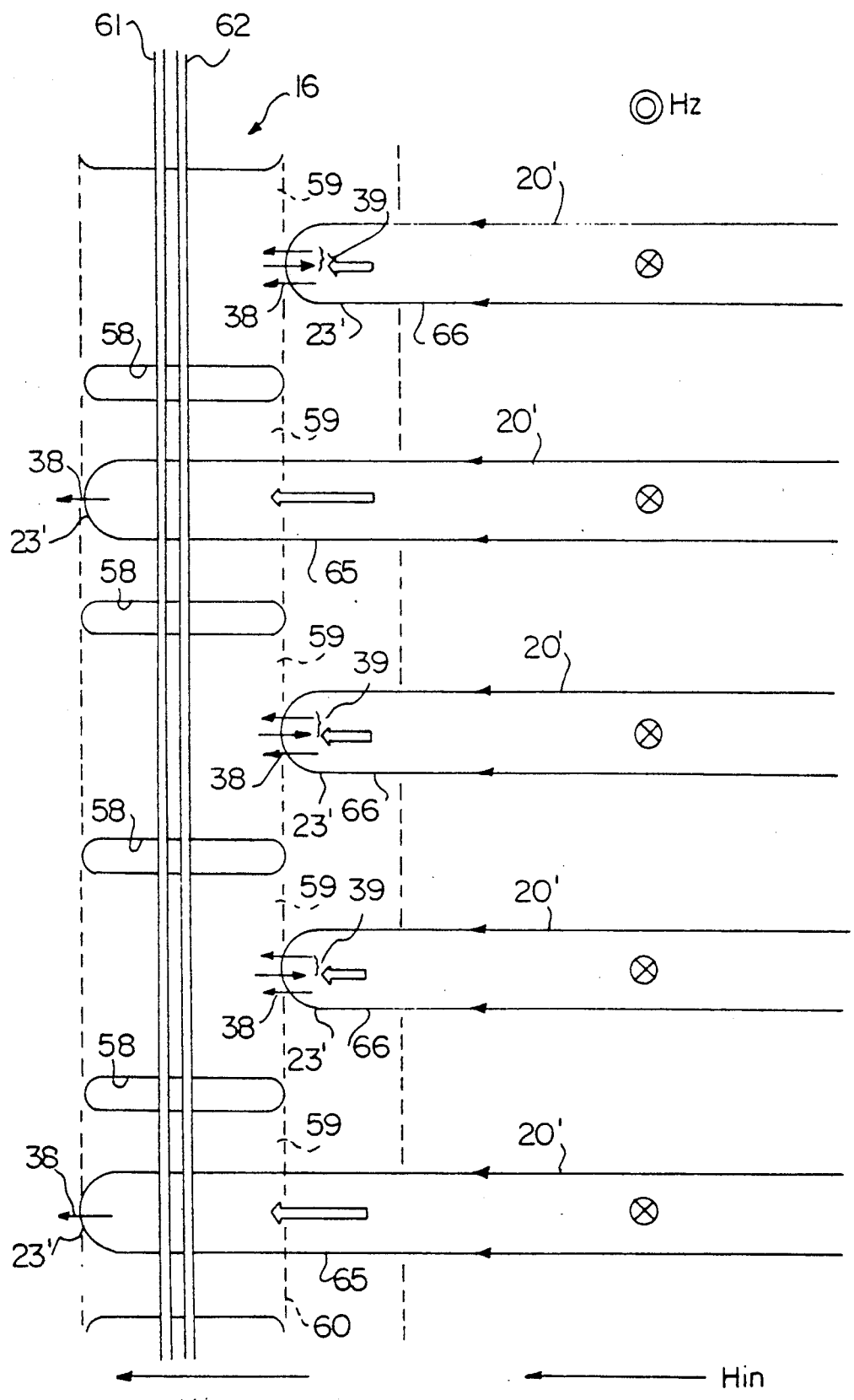

Referring to FIG. 1 and FIG. 3(b), the mere domains are expanded by the strong pulsed magnetic field into mere expanded domains 65 at the first expanding speed. The memory domains are expanded into expanded memory domains 66 at the second expanding speed. Each of the expanded memory domains 66 is what is called the expanded magnetic domain 20' in connection with FIG. 2(c).

After lapse of the predetermined time interval, the mere expanded domains 65 are extended into the gate portions 59 beyond the potential barrier portion 60. The expanded memory domains 66 only reach the gate potential barrier portion 60.

The read-out current source 49 is controlled by the control circuit 29 to supply pulsed electric currents to the first and the second gate conductors 61 and 62 towards the top of FIG. 3(b). The mere expanded domains 65 are chopped at the expanded second end portion 23' to produce the magnetic bubbles 50 (FIG. 1). It is to be noted in connection with FIG. 3(b) that the magnetic bubble 50 is produced not from the memory domain but from the mere domain. Each magnetic bubble 50 is transferred towards the bottom of FIG. 1 along the second strip line 12 by the read-out driver 53. Each magnetic bubble 50 is detected by the bubble detector 55 into the output signal.

On making one of the magnetic domains 20 memorize a new information signal as the Bloch lines of a pair, it is necessary to erase the Bloch line pair 39 generated before supplying a new information signal to the control circuit 29. This is done by making the first magnetic source 31 generate a strong pulsed magnetic field during a time interval which is longer than the predetermined time interval and is, for example, 2 microseconds long. This stronger pulsed magnetic field expands the mere and the memory domains 20 into the write-in section 15. Erasure of the Bloch line pair 39 proceeds in the manner known in the art to leave the single Bloch line 38 in the magnetic domain under consideration.

In the manner described in conjunction with FIGS. 1 and 3(b), the first magnetic source 31 is controlled by the control circuit 29 to supply the strong pulsed magnetic field to the principal surface. It is therefore possible to understand that the first magnetic source 31 is operable as a strengthening circuit for strengthening the pulsed magnetic field described in connection with FIG. 2(c). The read-out current source 49 is controlled by the control circuit 29 to supply the pulsed electric current to the first and the second gate conductors 61 and 62. As a result, the mere expanded domains 65 are chopped at their expanded second end portions 23' to produce the magnetic bubbles 50. It is therefore possible to understand that the read-out current source 49 and the first and the second gate conductors 61 and 62 are operable collectively as a circuit which produces a magnetic bubble when the magnetic domain is expanded to reach the read-out area. Each magnetic bubble 50 is detected by the bubble detector 55 which produces a corresponding output signal. Therefore, the bubble detector 55 serves both to detect the magnetic bubble and to produce the output signal representative of the information signal.

In the manner described in conjunction with FIGS. 1 and 3(b), the second magnetic source 57 is controlled by the control circuit 29 to supply an in-plane magnetic field Hipo. The in-plane magnetic field Hipo holds the single Bloch line 38 and the Bloch line pair 39 at the second end portion 23 of the magnetic domain 20. Therefore, the second magnetic source 57 serves as a circuit which generates an in-plane magnetic field orthogonal to the easy axis to hold the single Bloch line and the pair of Bloch lines at the predetermined end portion before the pulsed magnetic field is strengthened by the strengthening circuit.

In the manner described in conjunction with FIGS. 1 and 3(b), the read-out current source 49 is controlled by the control circuit 29 to supply the pulsed electric current to the first and the second gate conductors 61 and 62. As a result, the mere expanded domains 65 are chopped at their expanded end portions 23' to produce the magnetic bubble 50. The first and the second gate conductors 61 and 62 serve collectively as a conductor portion extending along the read-out area. The read-out current source 49 is operable as a current supply circuit for supplying a pulsed current to the conductor portion to chop the expanded magnetic domain into the magnetic bubble when the predetermined time interval lapses.

While this invention has thus far been described in conjunction with a single embodiment thereof, it will readily be possible for those skilled in the art to put this invention into practice in various manners. For example, grooves may be formed in the write-in section 15 in a manner similar to the groove 58 of the read-out section 16. The write-in operation and the read-out operation may be carried out at the same end portion of one of the magnetic domains.

What is claimed is:

1. A Bloch-line memory device comprising:
    a magnetic medium having a principal surface and an easy axis of magnetization orthogonal to said principal surface, said magnetic medium including at least one magnetic domain having a domain wall which is orthogonal to said principal surface and has a pair of opposite end portions, said domain wall including a single Bloch line and optionally including a pair of Bloch lines representing an information signal, said magnetic medium further including a read-out area located on said principal surface and having a read-out area potential and a potential barrier portion located between said read-out area and a predetermined end portion of said magnetic domain, said potential barrier portion being orthogonal to said easy axis and having a barrier portion potential which is higher than said read-out area potential;
    means for generating a pulsed magnetic field parallel to said easy axis to expand said magnetic domain parallel to said principal surface;
    means for strengthening said pulsed magnetic field during a predetermined interval to expand said magnetic domain towards said read-out area;
    means for producing a magnetic bubble from a magnetic domain having said single Bloch line at said predetermined end portion when said magnetic domain is expanded into said read-out area; and
    means for detecting said magnetic bubble and producing an output signal.

2. A Bloch-line memory device as claimed in claim 1, further comprising:
    generating means for generating an in-plane magnetic field orthogonal to said easy axis to hold said single Bloch line and said pair of Bloch lines at said predetermined end portion before said pulsed magnetic field is strengthened by said strengthening means.

3. A Bloch-line memory device as claimed in claim 2, wherein said pulsed magnetic field expands said expanded magnetic domain beyond said potential barrier portion to produce said magnetic bubble when said field is strengthened and when said pair of Bloch lines is not held at said predetermined end portion.

4. A Bloch-line memory device as claimed in claim 3, wherein said producing means comprises:
    a conductor portion extending along said read-out area, and
    current supply means for supplying a pulsed current to said conductor portion to chop said expanded magnetic domain into said magnetic bubble when said predetermined interval lapses.

* * * * *